United States Patent
Lung

(10) Patent No.: US 9,466,566 B2
(45) Date of Patent: *Oct. 11, 2016

(54) STACKED BIT LINE DUAL WORD LINE NONVOLATILE MEMORY

(71) Applicant: MACRONIX INTERNATIONAL CO., LTD., Hsinchu (TW)

(72) Inventor: Hsiang-Lan Lung, Ardsley, NY (US)

(73) Assignee: Macronix International Co., Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/618,839

(22) Filed: Feb. 10, 2015

(65) Prior Publication Data
US 2015/0155236 A1    Jun. 4, 2015

Related U.S. Application Data

(60) Continuation of application No. 14/148,155, filed on Jan. 6, 2014, now Pat. No. 8,975,122, which is a division of application No. 13/163,363, filed on Jun. 17, 2011, now Pat. No. 8,624,299, which is a continuation of application No. 12/475,839, filed on Jun. 1, 2009, now Pat. No. 7,985,989, which is a continuation of application No. 12/184,181, filed on Jul. 31, 2008, now Pat. No. 7,700,415, which is a division of application No. 11/217,659, filed on Aug. 31, 2005, now Pat. No. 7,420,242.

(51) Int. Cl.
| H01L 23/52 | (2006.01) |
| H01L 23/525 | (2006.01) |
| H01L 27/10 | (2006.01) |
| H01L 27/102 | (2006.01) |
| H01L 27/105 | (2006.01) |
| H01L 23/50 | (2006.01) |

(52) U.S. Cl.
CPC ........... *H01L 23/5252* (2013.01); *H01L 23/50* (2013.01); *H01L 27/101* (2013.01); *H01L 27/1021* (2013.01); *H01L 27/1052* (2013.01); *H01L 2924/0002* (2013.01)

(58) Field of Classification Search
USPC .......................... 257/209, E23.147, E29.166
See application file for complete search history.

(56) References Cited

U.S. PATENT DOCUMENTS

| 4,489,478 A | 12/1984 | Sakurai |
| 5,441,907 A | 8/1995 | Sung et al. |
| 5,536,968 A | 7/1996 | Crafts et al. |
| 5,565,703 A | 10/1996 | Chang |
| 5,835,396 A * | 11/1998 | Zhang .................... G11C 17/12 257/E27.073 |
| 5,920,100 A | 7/1999 | Wen |
| 5,973,352 A | 10/1999 | Noble |
| 6,021,079 A | 2/2000 | Worley |
| 6,034,882 A | 3/2000 | Johnson et al. |
| 6,420,215 B1 | 7/2002 | Knall et al. |
| 6,627,530 B2 | 9/2003 | Li et al. |
| 6,727,544 B2 | 4/2004 | Endoh et al. |
| 6,768,661 B2 | 7/2004 | Vyvoda et al. |
| 7,985,989 B2 * | 7/2011 | Lung .................... H01L 27/101 257/209 |
| 8,624,299 B2 * | 1/2014 | Lung .................... H01L 27/101 257/209 |
| 8,975,122 B2 | 3/2015 | Lung |

* cited by examiner

*Primary Examiner* — Timor Karimy
(74) *Attorney, Agent, or Firm* — Yiding Wu; Haynes Beffel & Wolfeld LLP

(57) ABSTRACT

An arrangement of nonvolatile memory devices, having at least one memory device level stacked level by level above a semiconductor substrate, each memory level comprising an oxide layer substantially disposed above a semiconductor substrate, a plurality of word lines substantially disposed above the oxide layer; a plurality of bit lines substantially disposed above the oxide layer; a plurality of via plugs substantially in electrical contact with the word lines and, an anti-fuse dielectric material substantially disposed on side walls beside the bit lines and substantially in contact with the plurality of bit lines side wall anti-fuse dielectrics.

29 Claims, 13 Drawing Sheets

STACKED BIT LINE DUAL WORD LINE NONVOLATILE MEMORY

CROSS-REFERENCE TO RELATED APPLICATIONS

This application is a continuation of U.S. patent application Ser. No. 14/148,155 filed on 6 Jan. 2014, now U.S. Pat. No. 8,975,122, which application is a divisional of U.S. patent application Ser. No. 13/163,363 filed on 17 Jun. 2011, now U.S. Pat. No. 8,624,299, which application is a continuation of U.S. patent application Ser. No. 12/475,839 filed on 1 Jun. 2009, now U.S. Pat. No. 7,985,989, which application is a continuation of U.S. patent application Ser. No. 12/184,181 filed on 31 Jul. 2008, now U.S. Pat. No. 7,700,415, which application is a divisional of U.S. patent application Ser. No. 11/217,659, filed on 31 Aug. 2005, now U.S. Pat. No. 7,420,242.

BACKGROUND OF THE INVENTION

1. Field of the Invention

The present invention relates to nonvolatile memory devices and, more particularly, to arrangements of nonvolatile memory devices with each memory level stacked level by level above a semiconductor substrate.

2. Description of Related Art

A nonvolatile semiconductor memory device is typically designed to securely hold data even when power is lost or removed from the memory device. Several types of nonvolatile memory devices have been proposed in the related art, examples of which include U.S. Pat. No. 4,489,478 (the '478 patent) to Sakurai, U.S. Pat. No. 5,441,907 (the '907 patent) to Sung et al., U.S. Pat. No. 5,536,968 to Crafts et al. (the '968 patent), U.S. Pat. No. 5,565,703 to Chang (the '703 patent), U.S. Pat. No. 5,835,396 (the '396 patent) to Zhang, and U.S. Pat. No. 6,034,882 (the '882 patent) to Johnson et al.

The nonvolatile memory devices taught by the '907 and '968 patents appear to suffer from a disadvantage wherein the number of nonvolatile devices per unit area of semiconductor substrate is limited by their arrangement in a two-dimensional structure. The device taught by the '907 patent does not appear to be electrically programmable. Furthermore, the polysilicon fuse array structure disclosed in the '968 patent has the disadvantage that the fuse arrays appear to require relatively large separations between adjacent elements, and the vertical anti-fuse structures described in the '703, 396 and '882 patents appear to require substantial areas of the semiconductor floor plan.

Needs thus exist in the related art for nonvolatile memory devices that can be implemented with an increased number of nonvolatile memory devices per unit area of semiconductor substrate, that are electrically programmable at sufficiently high programming rates and that occupy a reduced area of semiconductor floor plan.

SUMMARY OF THE INVENTION

The present invention addresses these needs by providing, in accordance with one aspect, nonvolatile memory devices and methods for making the same that can be implemented to provide increased numbers of nonvolatile memory cell devices per unit area of semiconductor substrate. An arrangement of the nonvolatile memory devices of the present invention can have a plurality of memory levels stacked level by level above a semiconductor substrate, programmable on both positive and negative swings of a programming current pulse cycle, having a reduced requirement for semiconductor floor plan, and being able to store at least one data bit per cell.

The invention disclosed may comprise an arrangement of nonvolatile memory devices having a plurality of memory levels stacked level by level above a semiconductor substrate, wherein each memory level comprises a semiconductor substrate, an oxide layer disposed substantially above the semiconductor substrate, pairs of word lines disposed substantially above the semiconductor substrate, a plurality of bit lines disposed substantially above the semiconductor substrate, an anti-fuse dielectric material disposed on side walls substantially beside the bit lines and substantially in contact with the bit lines and a plurality of via plugs substantially in electrical contact with the word lines. The present invention may include word lines arranged, according to one embodiment, singly, or, according to another embodiment, in pairs.

In the presently preferred embodiment, a nonvolatile memory device is fabricated by providing a semiconductor substrate, forming an oxide layer disposed substantially above the semiconductor substrate, forming a pair of word lines disposed substantially above the oxide layer, forming a plurality of bit lines disposed substantially above the oxide layer, forming an anti-fuse dielectric material substantially disposed beside the plurality of bit lines and substantially in contact with the plurality of bit lines, etching a plurality of via between the plurality of word lines and the plurality of bit lines and, forming a plurality of via plugs substantially in electrical contact with the plurality of word lines.

According to one aspect of the present invention, an arrangement of nonvolatile memory devices, having at least one memory device level stacked level by level above a semiconductor substrate, is provided. Each memory level comprises an oxide layer substantially disposed above a semiconductor substrate, a pair of word lines substantially disposed above the oxide layer, a plurality of bit lines substantially disposed above the oxide layer, a plurality of via plugs substantially in electrical contact with the word lines, and anti-fuse dielectric materials substantially disposed on side walls beside the bit lines and substantially in contact with the anti-fuse dielectric materials.

Any feature or combination of features described herein are included within the scope of the present invention, provided that the features included in any such combination are not mutually inconsistent as will be apparent from the context, this specification, and the knowledge of one of ordinary skill in the art. Additional advantages and aspects of the present invention are apparent in the following detailed description and claims.

DETAILED DESCRIPTION OF PREFERRED EMBODIMENTS

Figure 1:
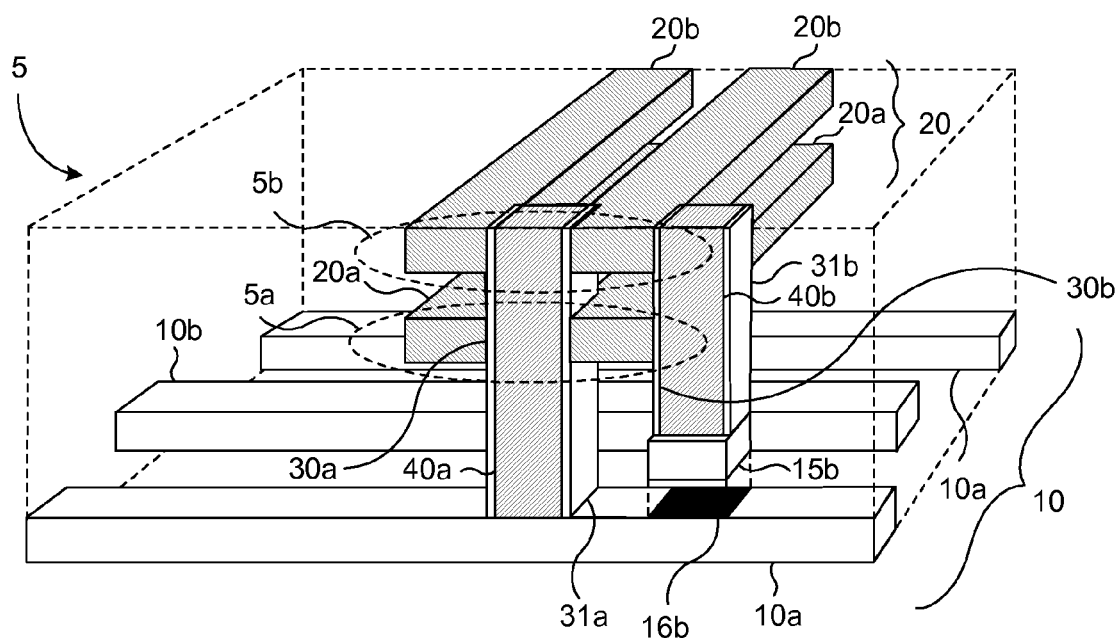
FIG. 1 is a perspective view of a nonvolatile memory device in accordance with an illustrative embodiment of the present invention.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in greatly simplified form and are not to precise scale. In reference to the disclosure herein, for purposes of convenience and clarity only, directional terms, such as, top, bottom, left, right, up, down, above, below, beneath, rear and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives and equivalents as may fall within the spirit and scope of the invention as defined by the appended claims. For example, it is understood by a person of ordinary skill in the art that the anti-fuse dielectric materials of the present invention may be formed of insulating materials such as silicon dioxide ($SiO_2$), silicon nitride (SiN), aluminum oxide ($Al_2O_3$), hafnium oxide ($HfO_2$), or the like.

It is to be understood and appreciated that the process steps and structures described herein do not cover a complete process flow for the manufacture of nonvolatile memory devices. The present invention may be practiced in conjunction with various integrated circuit fabrication and operation techniques that are conventionally used in the art, and only so much of the commonly practiced process steps are included herein as necessary to provide an understanding of the present invention.

Referring more particularly to the drawings, FIG. 1 shows a perspective view of a portion of a nonvolatile memory device 5 having a plurality of orthogonally arranged word lines 10 and bit lines 20. The nonvolatile memory device is substantially disposed above an oxide layer (not shown), which is substantially disposed above a semiconductor substrate (also not shown). The word lines 10 of the nonvolatile memory device 5 comprise first word lines 10a substantially disposed on a first horizontal plane relative to the oxide layer and second word lines 10b substantially disposed on a second horizontal plane relative to the oxide layer. The plurality of bit lines 20 may be disposed on a plurality of horizontal planes relative to the oxide layer. For example, as presently embodied, two layers of bit lines 20 of the nonvolatile memory device 5 are illustrated comprising first bit lines 20a substantially disposed on a third horizontal plane relative to the oxide layer and second bit lines 20b substantially disposed on a fourth horizontal plane relative to the oxide layer. Bit lines arranged layer by layer as described may be said to form a "stack" of bit lines.

In the illustrated embodiment, the word lines 10 are formed before the bit lines 20, wherein for example the first word lines 10a are formed before the second word lines 10b and wherein the first bit lines 20a are formed before the second bit lines 20b. The first word lines 10a and second word lines 10b may be arranged into sets such as pairs of dual word lines, wherein, for example, a bit line may connect (through a via plug) to first and second word line of a dual word line pair. Additionally, an individual word line may connect to a plurality of bit lines. In accordance with one aspect of the present invention, a nonvolatile memory device according to the present invention may comprise a plurality of first nonvolatile memory cells 5a substantially disposed above an oxide layer substantially disposed above a semiconductor substrate and having a plurality of orthogonally arranged word lines 10 and bit lines 20a and a plurality of second nonvolatile memory cells 5b substantially disposed above the oxide layer substantially disposed above the semiconductor substrate and having a plurality of orthogonally arranged word lines 10 and bit lines 20b. The plurality of first nonvolatile memory cells 5a may comprise a first nonvolatile memory device, and the plurality of second nonvolatile memory cells 5b may comprise a second nonvolatile memory device. First nonvolatile memory cells 5a may similarly be associated, for example, with first bit lines 20a; second nonvolatile memory cells 5b may likewise be associated with second bit lines 20b. Both first and second nonvolatile memory cells 5a and 5b connect in the illustrated embodiment to first word lines 10a and second word lines 10b through respective first and second via plugs 40a and 40b. The first and second via plugs 40a and 40b have disposed on sidewalls thereof anti-fuse dielectric material 30a, 31a, 30b, and 31b.

The word lines 10 of the plurality of first memory cells 5a comprise first word lines 10a substantially disposed on a first horizontal plane relative to the oxide layer and second word lines 10b substantially disposed on a second horizontal plane relative to the oxide layer. Moreover, as presently embodied, the bit lines of the plurality of first memory cells 5a comprise first bit lines 20a substantially disposed on a third horizontal plane relative to the oxide layer.

The word lines 10 of the plurality of second memory cells 5b comprise first word lines 10a substantially disposed on a first horizontal plane relative to the oxide layer and second word lines 10b substantially disposed on a second horizontal plane relative to the oxide layer. Moreover, as presently embodied, the bit lines of the plurality of second memory cells 5b comprise second bit lines 20b substantially disposed on a fourth horizontal plane relative to the oxide layer. Additional levels of nonvolatile memory cells may be provided in modified embodiments by providing additional bit lines substantially disposed on additional horizontal planes relative to the oxide layer.

A first anti-fuse dielectric material 30a and 31a formed of, e.g., silicon dioxide ($SiO_2$) may be substantially disposed on side walls beside first via plug 40a, which is substantially disposed between bit lines 20 and a first word line 10a. Similarly, a second anti-fuse dielectric material 30b and 31b may be substantially disposed on side walls beside second via plug 40b disposed between bit lines 20 and a second word line 10b. In a preferred embodiment, the first anti-fuse dielectric material 30a and 31a and the second anti-fuse dielectric material 30b and 31b have substantially the same dimensions and are made of substantially the same material.

Via etched between the word lines 10 and the bit lines 20 formed from polysilicon having a first type of background impurity are substantially filled by first and second via plugs (represented in FIG. 1 by first via plug 40a and second via plug 40b) formed from polysilicon doped with a background impurity of a second type opposite to the first type. For example, the bit lines 20 may be formed from polysilicon having an N-type background impurity type, and the first and second via plugs and may be formed from polysilicon having a P-type background impurity type.

Each bit line of the first bit lines 20a and the second bit lines 20b is coupled between one of the first word lines 10a and one of the second word lines 10b. More particularly, each of the first bit lines 20a is coupled to one of the first word lines 10a by means of one of the first anti-fuse dielectric materials 30a and 31a and one of the first via plugs, e.g., first via plug 40a. Each of the first bit lines 20a is further coupled to one of the second word lines 10b by means of one of the second anti-fuse dielectric materials 30b and 31b and one of the second via plugs, e.g., second via plug 40b. Moreover, each of the second bit lines 20b is coupled to one of the first word lines 10a by means of one of the first anti-fuse dielectric materials 30a and 31a and one of the first via plugs, e.g., first via plug 40a, and is coupled to one of the second word lines 10b by means of one of the second anti-fuse dielectric materials 30b and 31b and one of the second via plugs, e.g., second via plug 40b. The first via plugs 40a are substantially disposed above and are substantially in electrical contact with the first word lines 10a. The second via plugs are substantially disposed above and are substantially in electrical contact with the second word lines 10b.

FIG. 1 further illustrates an exemplary spatial relationship between first word lines 10a and second word lines 10b. Second word line 10b in the illustrated embodiment comprises a "shelf" portion 15b that extends over first word line 10a. The relative position of the shelf portion 15b and first word line 10a is depicted graphically in FIG. 1 by a "shadow" 16b of the shelf portion 15b on the first word line 10a. The shadow 16b, which is shown only for purposes of clarifying a portion of the geometry of the nonvolatile memory device 5, demonstrates that, e.g., first via plug 40a and second via plug 40b may be disposed in substantial linear alignment along a length dimension of one of the plurality of first word lines 10a.

Figure 2:
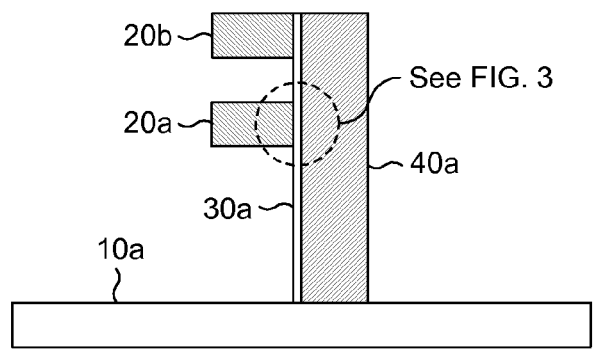
FIG. 2 is a pictorial diagram illustrating, in a frontal view, an exemplary interconnection of a stack of bit lines, anti-fuse dielectric material, a via plug, and a word line according to the present invention.
Figure 3A:
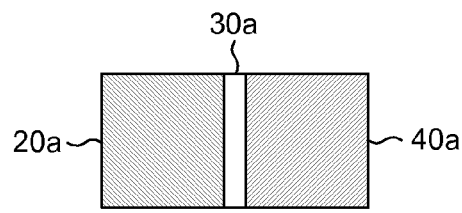
FIG. 3a is a pictorial diagram showing detail of a memory cell formed by an interconnection of the via plug, anti-fuse dielectric material, and a bit line shown in FIG. 2.

FIG. 2 is a pictorial diagram illustrating, in a frontal view, an exemplary interconnection of a stack of bit lines 20a and 20b, anti-fuse dielectric material 30a, a first via plug 40a, and a first word line 10a configured according to the present invention. The first word line 10a in the diagram connects to a first bit line 20a through a first via plug 40a and anti-fuse dielectric material 30a. Similarly, first word line 10a connects to a second bit line 20b through the first via plug 40a and anti-fuse dielectric material 30a. Detail of the interconnection of, e.g., first bit line 20a, anti-fuse dielectric material 30a, and first via plug 40a associated with an exemplary memory cell is shown in FIG. 3a. Anti-fuse dielectric material 30a is shown disposed substantially beside first bit line 20a and between first bit line 20a and first via plug 40a. Accordingly, substantially no electrical current can pass between first bit line 20a and first via plug 40a as long as anti-fuse dielectric material 30a remains intact. The intact form of anti-fuse dielectric material 30a may represent a default configuration for an exemplary memory cell, the default configuration corresponding, for example, to a logic '0' program state for the memory cell. It should be understood that additional bit lines (not shown) may connect to the first via plug 40a illustrated in FIG. 2. The additional bit lines may contact the first via plug 40a through additional first anti-fuse dielectric material 31a (FIG. 1) that may form additional memory cells. This concept is explained more fully in discussion below related to FIGS. 9 and 9a.

Figure 3B:
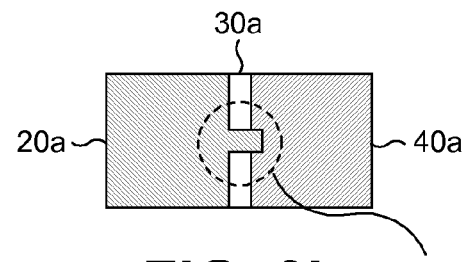
FIG. 3b is a pictorial diagram of a configuration of the memory cell of FIG. 3a programmed to a logic '1' program state.
Figure 4:
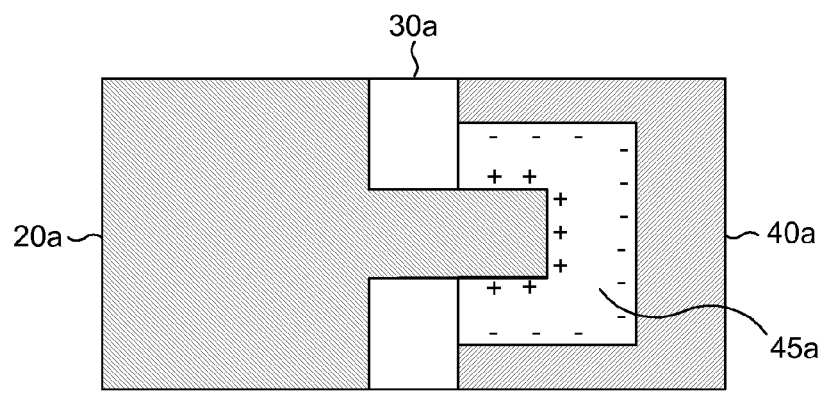
FIG. 4 is a pictorial diagram showing detail of a breakdown region in the memory cell of FIG. 3b.

FIG. 3b illustrates one modified configuration of the exemplary memory cell, the modified configuration corresponding to a logic '1' program state for the exemplary memory cell. The diagram shows a region 25a comprising a breakdown of the anti-fuse dielectric material 30a, a condition that may be induced, for example, by applying a relatively high voltage (i.e., a voltage higher than the breakdown voltage of the anti-fuse dielectric material 30a) between word line 10a (FIG. 2) and bit line 20a. FIG. 4 shows detail of the breakdown region 25a for an example wherein the bit line 20a is formed of N-type material and the via plug 40a is formed of P-type material. In that instance, a PN diode forms that exhibits, for example, a depletion region 45 at a boundary between the P and N areas. Such a PN diode may be capable of allowing current in a P-to-N direction while not supporting current in an N-to-P direction. A cell having intact anti-fuse dielectric material 30a (FIG. 3a), on the other hand, supports current in neither direction. Detection of the programmed state (i.e. '0' or '1') of a memory cell can be accomplished by applying an external voltage to a bit line and a word line associated (through a via plug) with a given memory cell and sensing a current magnitude. For example, if a voltage greater than a threshold voltage of the PN diode (e.g., greater than about 0.7 volts) is applied to a word line that is positive with respect to a chosen bit line, then a substantially zero value of sensed current indicates that a corresponding memory cell is programmed to a logic '0' state. If a current that exceeds a given threshold is sensed, then it may be determined that the memory cell is programmed to a logic '1' state. Bit line (e.g., N-type) material 20a in FIG. 4 "punches through" the anti-fuse dielectric material 30a causing breakdown of the anti-fuse dielectric material 30a. In another embodiment (not illustrated), via plug (e.g., P-type) material 40a may punch through the anti-fuse dielectric material 30a. Either phenomenon can form a PN diode consistent with programming the memory cell to a logic '1' state as described herein.

Figure 5:
FIG. 5 is a simplified diagram illustrating a top view of placement of first word lines according to an embodiment of the present invention.
Figure 6:
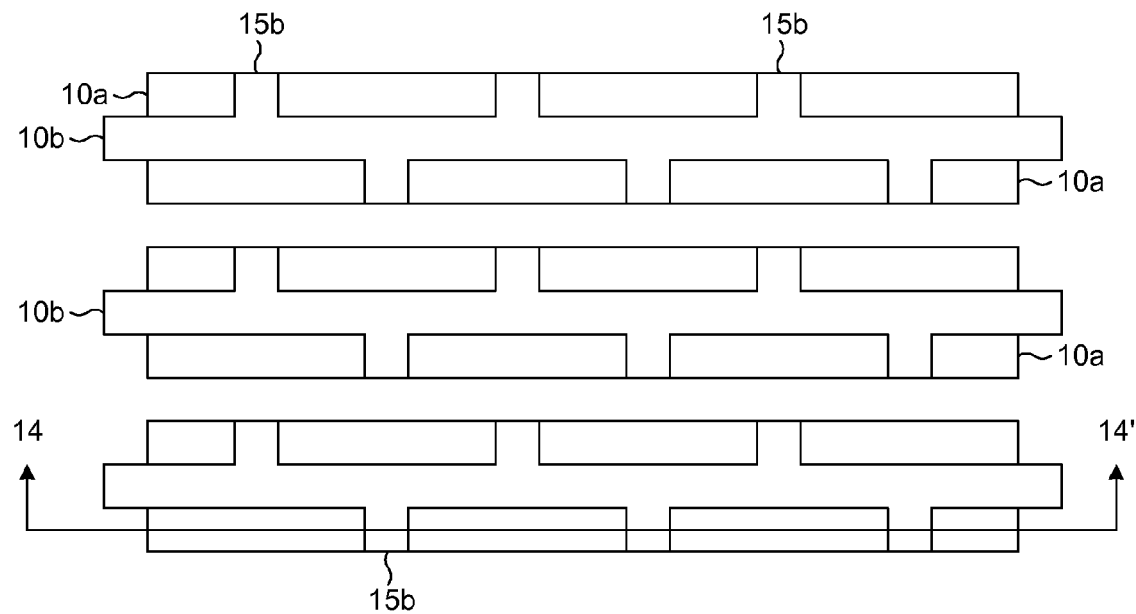
FIG. 6 is a top view of second word lines formed above the first word lines illustrated in FIG. 5.
Figure 7:
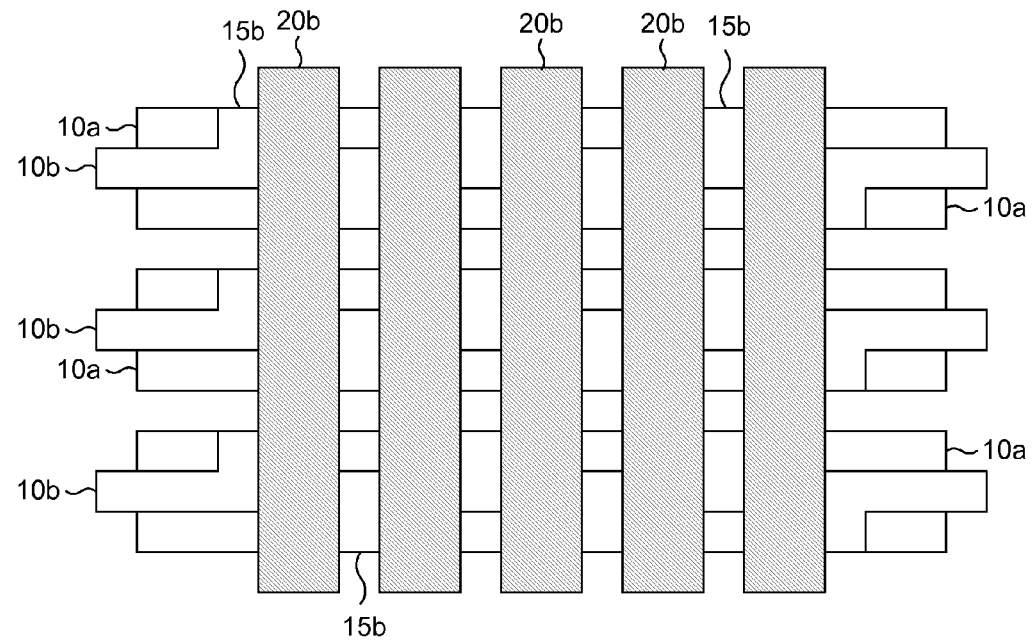
FIG. 7 is a top view illustrating a position of bit lines added to the structure shown in FIG. 6.

FIG. 5 is a simplified diagram illustrating a top view of placement of first word lines according to an embodiment of the present invention. First word lines 10a may be formed, for example, on an oxide layer that overlies a semiconductor substrate. Interposition of second word lines 10b with first word lines 10a is illustrated by a diagram in FIG. 6. Typically, second word lines 10b are disposed on an oxide layer formed above the first word lines 10a. In the illustrated embodiment, portions of the second word lines 10b are formed as shelves 15b (cf. FIG. 1) that are disposed substantially above the first word lines 10a. A result of adding bit lines 20 (FIG. 1) to the structure illustrated in FIG. 6 is shown in a top isometric view in FIG. 7. Bit lines 20b are shown in FIG. 7 that may, in a typical embodiment, be disposed above bit lines 20a (not shown) as well as above word lines 10a and 10b. Insulating material such as SiO$_2$ (not shown) may separate respective layers comprising, e.g. word lines 10a, word lines 10b, bit lines 20a, and bit lines 20b.

Figure 8:
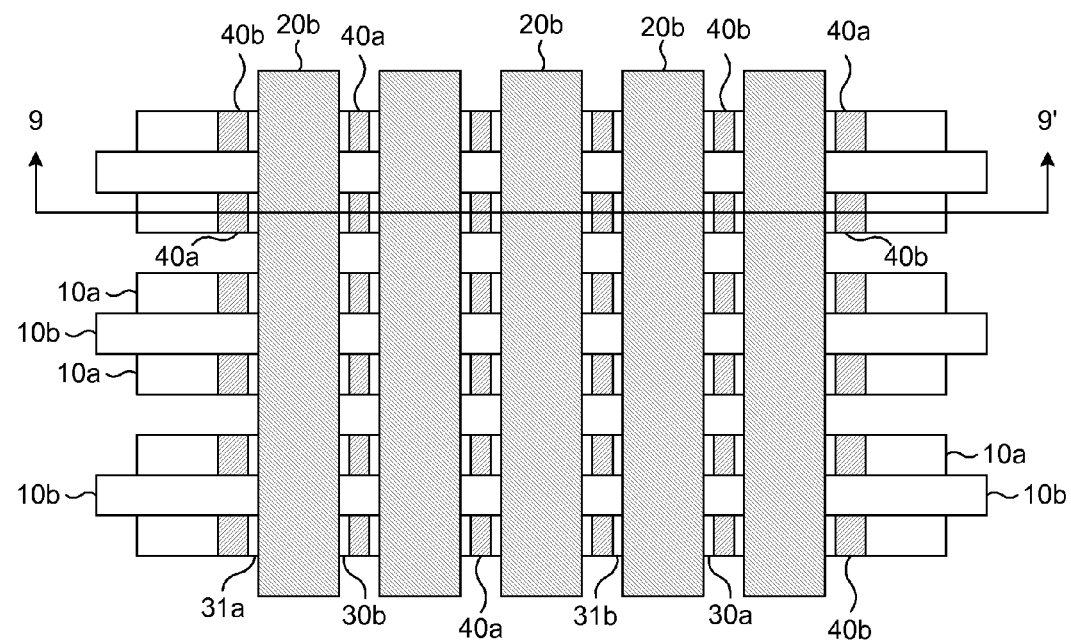
FIG. 8 is a pictorial top plan view of the nonvolatile memory device shown in FIG. 1 in accordance with an illustrated embodiment of the present invention.

Via plugs may be used to connect bit lines to word lines as illustrated in FIG. 1 and as further illustrated in a top view in FIG. 8. The structure in FIG. 8 represents the embodiment shown in FIG. 7 to which has been added a plurality of first via plugs 40a beside which is disposed a plurality of anti-fuse dielectric materials 30a and 31a that connect bit lines 20 (FIG. 1) to first word lines 10a. Similarly, a plurality of second via plugs 40b having a plurality of anti-fuse dielectric materials 30b and 31b disposed beside via plugs 40b connect bit lines 20 to second word lines 10b.

Figure 9:
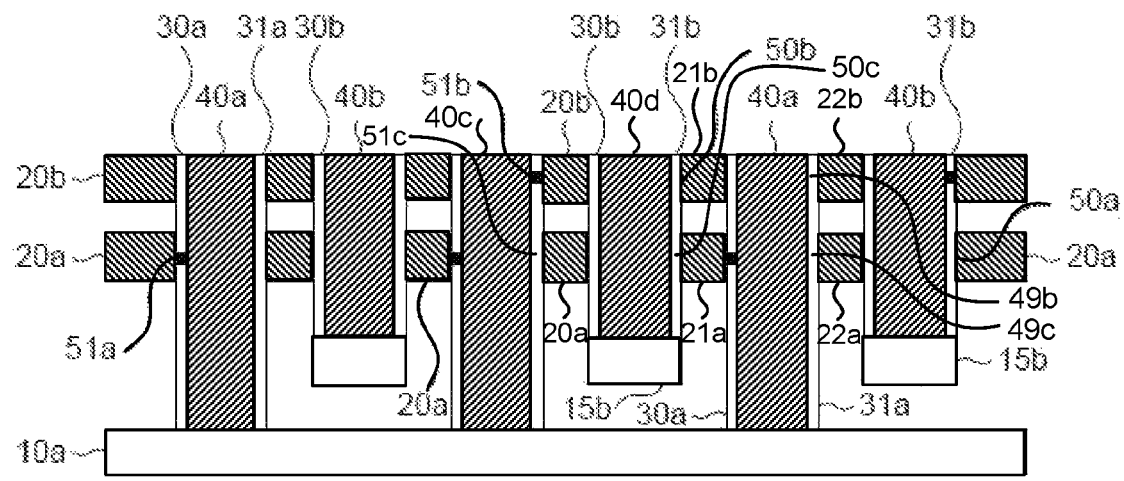
FIG. 9 is a pictorial cross-sectional view of the nonvolatile memory device of the embodiment illustrated in FIG. 8, taken along a line 9-9' of FIG. 8 in accordance with the present invention.

FIG. 9 is a cross-sectional view of the stacked bit line dual word line nonvolatile memory device illustrated in FIG. 8. The cross-section is taken along a line 9-9' of FIG. 8. The embodiment illustrated in FIG. 9 shows a first word line 10a, shelves 15b of second word lines 10b (shown in FIG. 1), first bit lines 20a, 21a and 22a, second bit lines 20b, 21b and 22b, first via plugs 40a and 40c, and second via plugs 40b and 40d. One of the first via plugs 40a in FIG. 9, for example, connects first word line 10a to one of the first bit lines 20a and to one of the second bit lines 20b through one of the anti-fuse dielectric materials 30a. The same first via plug 40a connects first word line 10a to another of the first bit lines 20a and to another of the second bit lines 20b through one of the anti-fuse dielectric materials 31a. One of the second via plugs 40b, on the other hand, connects second word line 10b (through shelf 15b) to one of the first bit lines 20a and to one of the second bit lines 20b through one of the anti-fuse dielectric materials 30b. Similarly, the same second via plug 40b connects second word line 10b (through shelf 15b) to another of the first bit lines 20a and to another of the second bit lines 20b through one of the anti-fuse dielectric materials 31b.

As described above with reference to FIGS. 2-4, the structure of FIG. 9 comprises a plurality of memory cells, for example, memory cells 49b, 49c, 50a, 51a, 50b, 51b, 50c and 51c that may assume a program state according to a condition of portions of anti-fuse dielectric material disposed between via plugs and bit lines. For example, memory cell 50a, comprising anti-fuse dielectric material 31b disposed between a second via plug 40b and a first bit line 20a is intact in the illustrated embodiment. As described above, intact anti-fuse dielectric material may correspond to a logic '0' program state. Memory cell 51b, comprising anti-fuse dielectric material 31a disposed between a first via plug 40a and a second bit line 20b, is broken down (represented by a dark rectangle) in the illustrated embodiment. Broken-down anti-fuse dielectric material may correspond to a logic '1' program state as is further described above with reference to FIGS. 2-4. Similarly, memory cell 51a may correspond to a logic '1' program state, and memory cell 50b may correspond to a logic '0' program state.

Figure 9A:
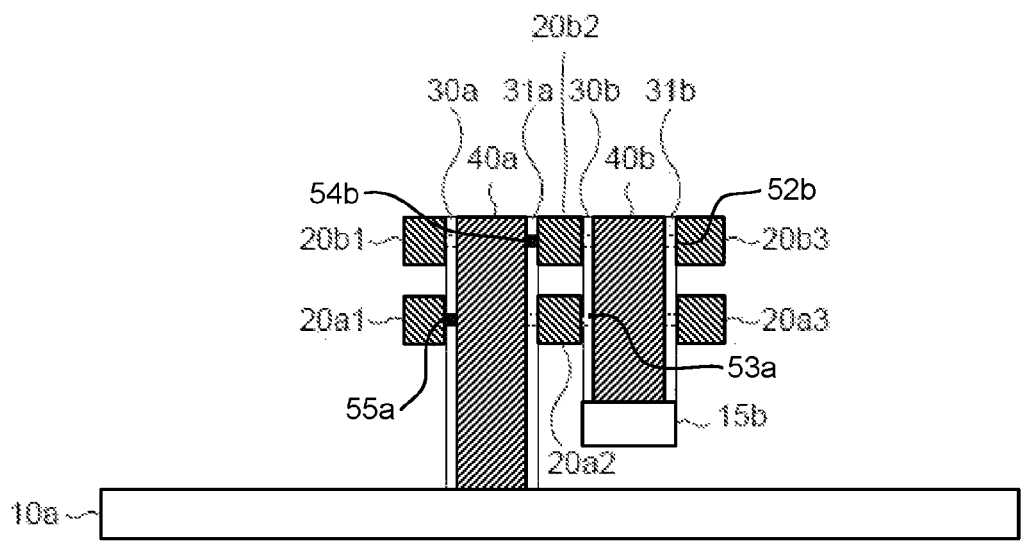
FIG. 9A is a detail of a portion of FIG. 9.

FIG. 9a is a detailed cross-sectional view of a portion of the nonvolatile memory device illustrated in FIG. 9. Six individual bit lines are identified in FIG. 9a, three of which (20a1, 20a2, and 20a3) are first bit lines 20a (FIG. 9) and three of which (20b1, 20b2, and 20b3) are second bit lines 20b. A first via plug 40a in FIG. 9a connects bit lines 20a1 and 20b1 to first word lines 10a through anti-fuse dielectric material 30a. First via plug 40a further connects bit lines 20a2 and 20b2 to first word line 10a through anti-fuse dielectric material 31a. Second via plug 40b connects bit lines 20a2 and 20b2 to second word line 10b (invisible) through shelf portion 15b through anti-fuse dielectric material 30b. Bit lines 20a3 and 20b3 are connected to first word line 10b by via plug 40b through anti-fuse dielectric material 31b. A total of eight memory cells are depicted in FIG. 9a, the memory cells (e.g. 52b, 53a, 54b and 55a) corresponding to regions of anti-fuse dielectric material that are disposed between a via plug and a bit line. Memory cells programmed to a logic '1' state as described herein are illustrated as dark rectangles. Memory cells that are not programmed (i.e., are programmed to a logic '0' state) are illustrated as white rectangles with a dotted border. For example, the memory cell (e.g. 55a) disposed between bit line 20a1 and via plug 40a is programmed to a logic '1' as is the memory cell (e.g. 54b) disposed between via plug 40a and bit line 20b2. Conversely, the memory cell disposed between via plug 40b and bit line 20b2, the memory cell disposed between via plug 40b and bit line 20a3, and the memory cell disposed between via plug 40a and bit line 20b1 are programmed to a logic '0'.

Figure 10:
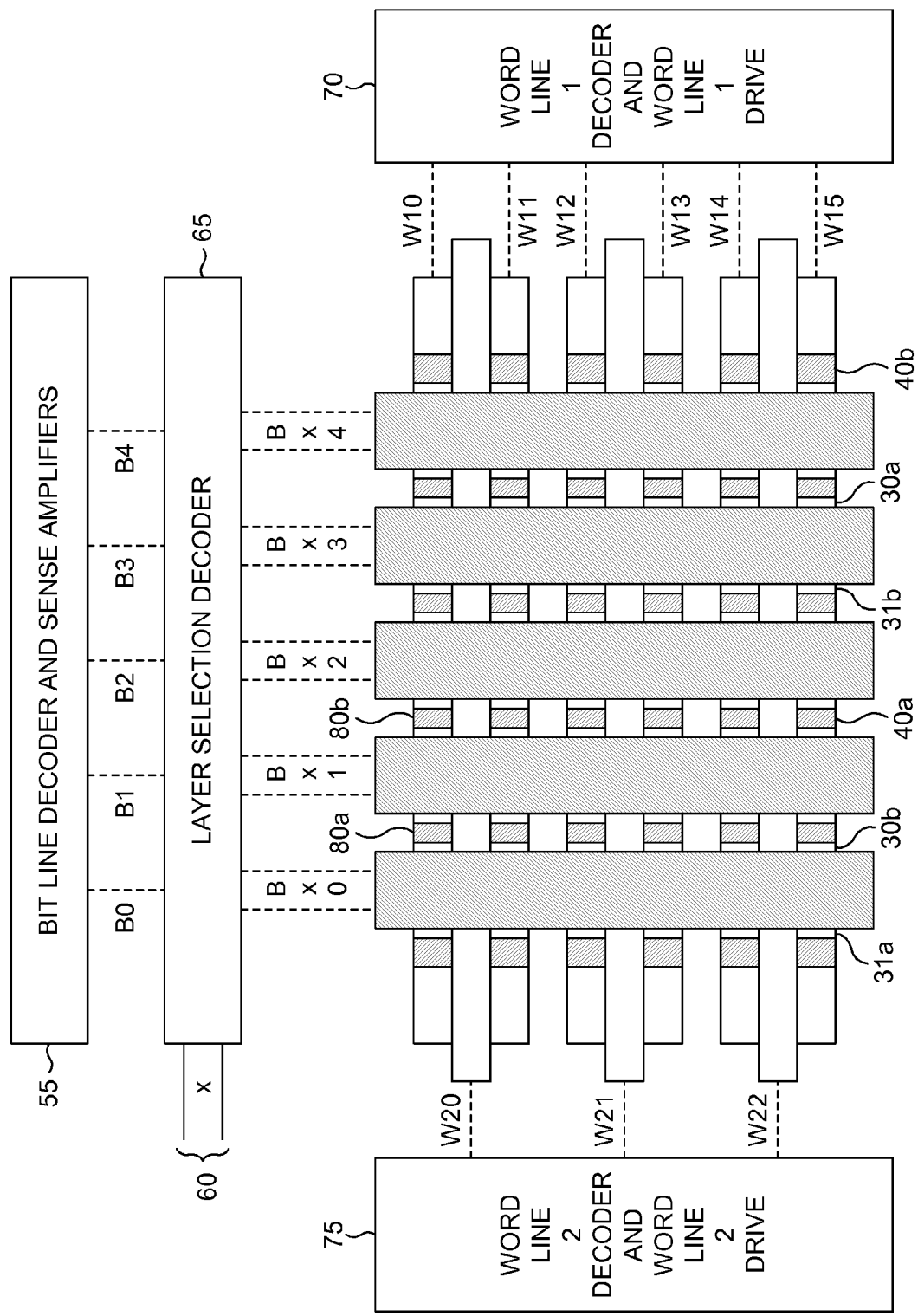
FIG. 10 is a schematic diagram of an embodiment of a stacked bit line dual word line nonvolatile memory device including circuitry capable of addressing memory elements in the device.

FIG. 10 is a schematic diagram of an embodiment of a stacked bit line dual word line nonvolatile memory device including circuitry that may be employed to address memory elements in the device. For purposes of illustration, bit lines in the diagram are denoted by Bx0, Bx1, . . . , Bx4 where 'x' denotes a layer of a bit line. That is, bit lines on a first layer (e.g., bit lines 20a in FIGS. 1 and 9) may be denoted by B10, B11, . . . , B14; bit lines on a second layer (e.g., bit lines 20b in FIGS. 1 and 9) may be denoted by B20, B21, . . . , B24, and so on for layers more than two. Word lines in the diagram are similarly identified, with first word lines being denoted by W10, W11, . . . , W15, and second word lines being denoted by W20, W21, and W22. Addressed memory elements may be programmed, or their program state determined using circuitry similar to that illustrated in FIG. 10. Correspondences among reference numbers in FIGS. 8, 9, and 10 should be noted in the following description.

The embodiment illustrated in FIG. 10 includes a bit line decoder and sense amplifiers 55 that connect to bit lines through a layer selection decoder 65. The layer selection decoder 65 may select from one of a plurality of layers of bit lines. For example, using two selection lines 60, the layer selection decoder 65 may select between two layers of bit lines 20a and 20b as illustrated, for example, in FIGS. 1 and 9. For embodiments having more than two, i.e. three or more, layers of bit lines, additional selection lines may be employed in addition to the two selection lines 60 shown in the diagram. The layer selection decoder 65 operates by selecting a layer 'x' of bit lines and by providing an electrical connection between the selected layer 'x' of bit lines and the bit line decoder and sense amplifiers 55. Accordingly, bit lines as observed by the bit line decoder and sense amplifiers

55 are denoted as B0, B1, . . . , B4 in the diagram, it being understood that layer selection is transparent to the bit line decoder and sense amplifiers 55. Word lines may be accessed by a first word line decoder and word line drive 70 and by a second word line decoder and word line drive 75. First word line decoder and word line drive 70 is electrically connected to and is capable of accessing first word lines W10, W11, . . . , W15 (denoted as 10*a* in FIGS. 1 and 6, for example). Second word line decoder and word line drive 75 is electrically connected to and is capable of accessing second word lines W20, W21, and W22 (denoted as 10*b* in FIGS. 1 and 6).

Bit lines in the embodiment shown in the diagram are fabricated of N-type material; via plugs are fabricated of P-type material. Consider, for example, the via plug 80*a* in the diagram. Comparison with FIGS. 6-8 confirms that via plug 80*a* is a first via plug (e.g., first via plug 40*a* in FIG. 1) that is disposed on a first word line 10*a*, specifically, first word line W10 in the diagram. Via plug 80*a* has disposed on both sides thereof, anti-fuse dielectric material 30*a* and 31*a* that makes contact with respective sets of bit lines Bx0 and Bx1. For example, with two layers of bit lines, via plug 80*a* connects through anti-fuse dielectric material 30*a* and 31*a* to bit lines B10 and B11 on the first level and to bit lines B20 and B21 on the second level. Each of the contacts may be in a broken-down or an intact state according to a programmed state for a memory cell associated with each contact.

Figure 11:
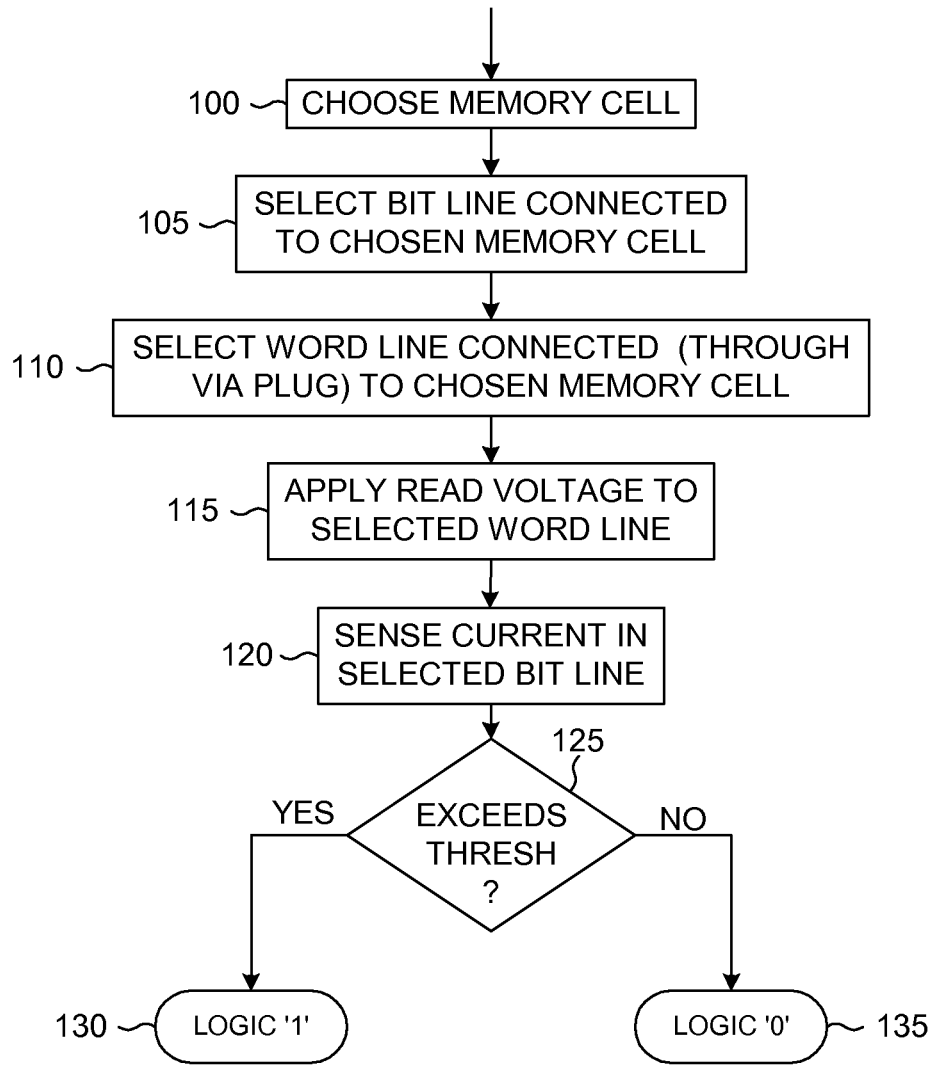
FIG. 11 is a flow diagram depicting an implementation of a method of determining a program state of a memory cell according to the present invention.

A program state, i.e., logic '0' or logic '1' as described above, of a memory cell in the illustrated memory device can be determined in general, according to an implementation of a method of the present invention as illustrated in a flow diagram in FIG. 11. The illustrated implementation comprises choosing a memory cell at step 100. Each memory cell has connected thereto a unique bit line, which is selected at step 105. The selected bit line should be grounded through a sense amplifier. Referring, for example, to FIG. 9, memory cell 51*b* may be selected. A chosen memory cell further has connected thereto a unique via plug that connects, in turn, to a unique word line, which is selected at step 110. For example, word line 10*a* is selected in FIG. 9 as the word line that is connected to memory cell 51*b* (through a via plug 40*a*). A negative read voltage is then applied to the selected word line at step 115, and a current is sensed in the selected bit line 120, which should be connected to ground through a low-impedance path. Typical values for a read voltage may range from about 1 volts to about 2 volts, about 1.5 volts in a preferred embodiment. A test of current magnitude is performed at step 125 by comparing the magnitude of the sensed current with a current threshold. If the magnitude of the sensed current exceeds the current threshold, then it may be inferred that the anti-fuse dielectric material in the memory cell has broken down, and the program state of the memory cell is decided to be logic '1' at step 130. If the magnitude of the sensed current does not exceed the current threshold, then the program state of the memory cell may be decided to be a logic '0', assuming that the anti-fuse dielectric material in the memory cell is intact.

According to another implementation of the method (not illustrated), a plurality of memory cells in a chosen level may be read simultaneously. In that instance, a level of memory cells may be chosen at step 100 using, e.g., selection lines 60 as illustrated in FIG. 10. A plurality of bit lines adjacent to the memory cells is then grounded through sense amplifiers (e.g. bit line decoder and sense amplifiers 55 in FIG. 10) at step 105. Remaining steps of this implementation of the method may follow the steps illustrated in FIG. 11.

Figure 12:
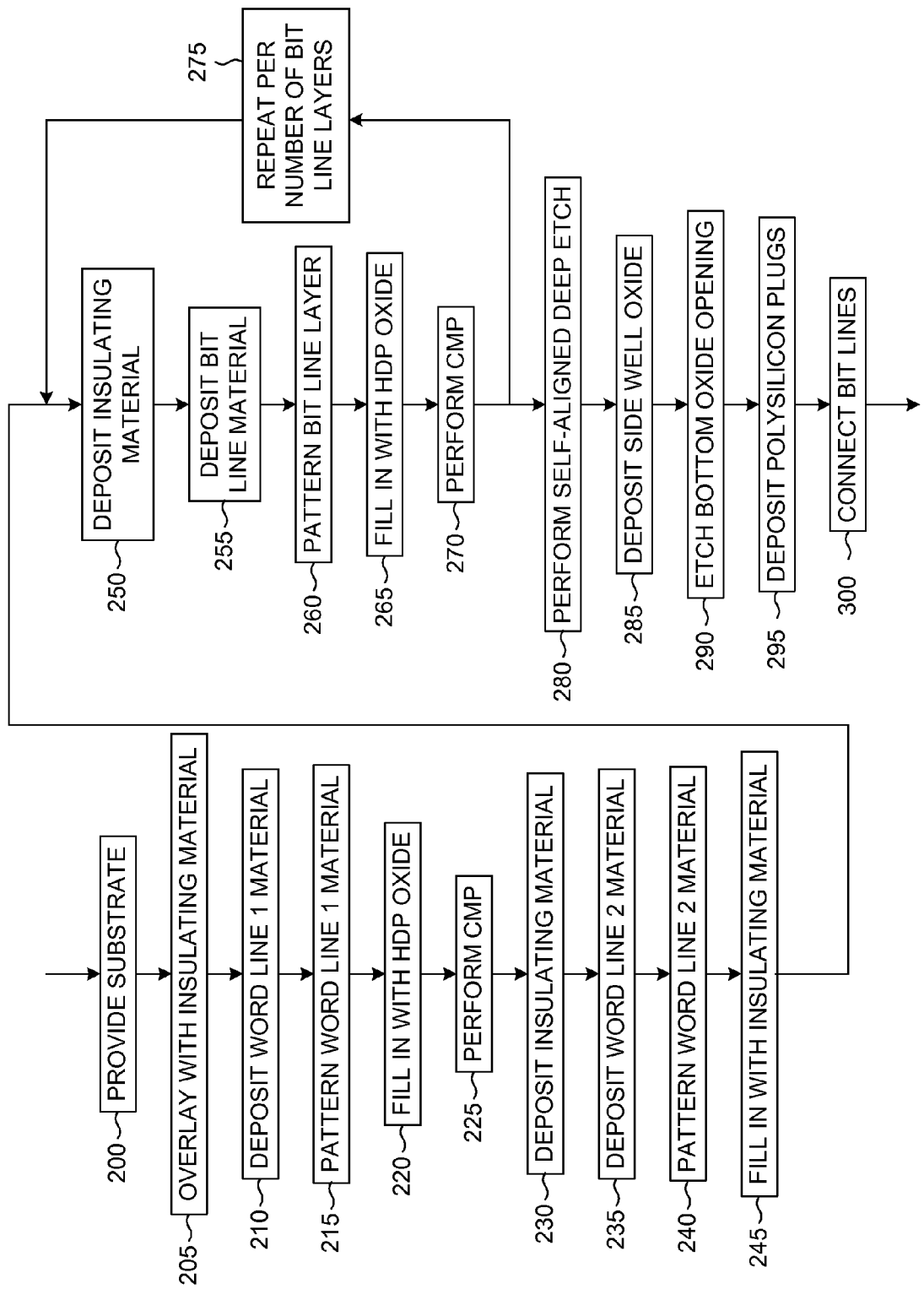
FIG. 12 is a flow diagram describing an implementation of a method of fabricating an arrangement of nonvolatile memory devices in accordance with the present invention.
Figure 13:
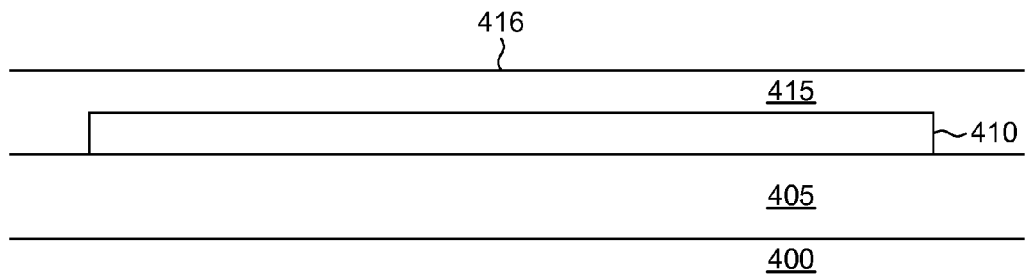
FIGS. 13-18 are cross-sectional diagrams illustrating results of applying steps of the method illustrated in FIG. 12.
Figure 14:
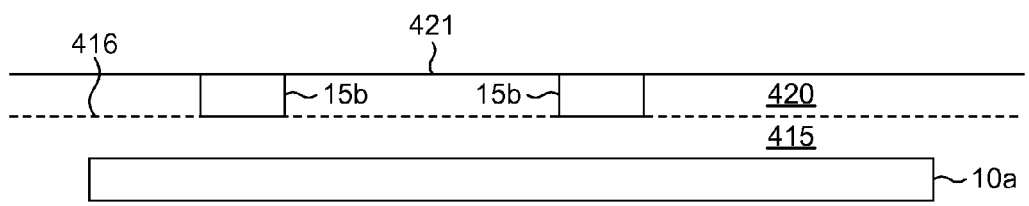
Figure 15:
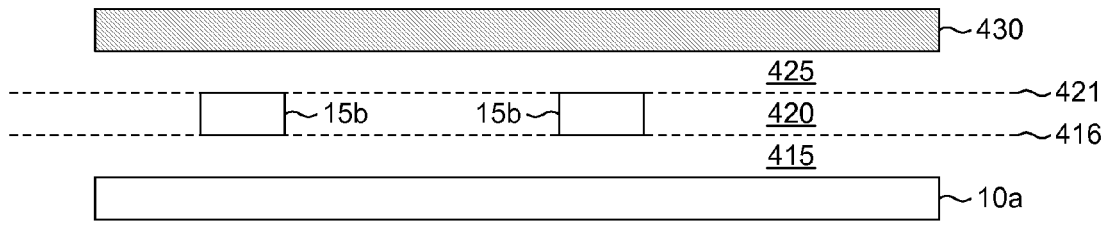

A method of the present invention for fabricating an arrangement of nonvolatile memory devices is illustrated, according to an exemplary implementation in a flow diagram in FIG. 12. FIGS. 13-22 illustrate results of applying steps of the method. The implementation of the method may comprise providing a semiconductor substrate 400 (FIG. 13) at step 200. An insulating layer 405, which may comprise $SiO_2$, may be formed substantially above the semiconductor substrate 400 at step 205, after which a layer of first word line material 410 may be deposited at step 210. The layer of first word line material 410, which may be formed, for example, of tungsten (W), tantalum (Ta), platinum (Pt), polycide plus polysilicon, or the like may be deposited to a thickness ranging from about 200 nm to about 400 nm, preferably about 250 nm. The layer of first word line material 410 may be patterned at step 215 to create a substantially parallel plurality of first word lines 10*a* substantially disposed above the insulating layer 405 as illustrated, for example, in FIG. 5. Spaces between the first word lines 10*a* may then be filled in with high density plasma (HDP) oxide at step 220 after which a chemical mechanical polishing (CMP) step is performed, stopping when the layer of first word lines 10*a* is reached. Another layer of insulating material 415, e.g., $SiO_2$, may then be deposited at step 230 to a thickness ranging from about 100 nm to about 200 nm, preferably about 150 nm. A reference line 416 is shown in FIGS. 13-15 illustrating an example of an upper limit of the layer 415 of insulating material. A second layer of word line material may be deposited at step 235 to a thickness of between about 200 nm and about 400 nm, preferably about 250 nm. The second layer of word line material may be patterned at step 240 to form second word lines 10*b* according to a layout illustrated, for example, in FIG. 6. As embodied in FIG. 6, second word lines 10*b* comprise shelf portions 15*b* that may be disposed above first word lines 10*a* as already described. An exemplary result of performing step 240 of the method is shown in FIG. 14, which is a cross-sectional view taken along a line 14-14' in FIG. 6 after performing a fill-in of additional insulating material 420, e.g., $SiO_2$, at step 245. One implementation of the method performs CMP after step 245, stopping on the layer of second word lines 10*b*, which layer is also occupied by the shelf portions 15*b* illustrated in FIG. 14. A reference line 421 in FIGS. 14 and 15 is included to illustrate an example of a position of an upper surface of the layer of second word lines 10*b* (including shelf portions 15*b*).

Another layer of insulating material 425 (FIG. 15), e.g., $SiO_2$, is then deposited on the layer of second word lines 10*b* (not visible in FIG. 15) at step 250 to a thickness of between about 60 nm and about 100 nm, preferably about 80 nm. A first layer of bit line material 430, which may comprise, for example, N-type polysilicon, is then deposited at step 255. The first layer of bit line material 430 may be patterned at step 260 to form a first plurality of bit lines 20*a* substantially disposed above the layer of insulating material 425 and extending longitudinally into the plane of the diagram in FIG. 16. The patterning may provide for a nominally uniform spacing 22 between adjacent bit lines. After performing a fill-in step with, e.g., HDP oxide at step 265, CMP performed at step 270 may be used to form a flat upper surface of the first plurality of bit lines 20*a*.

Figure 16:
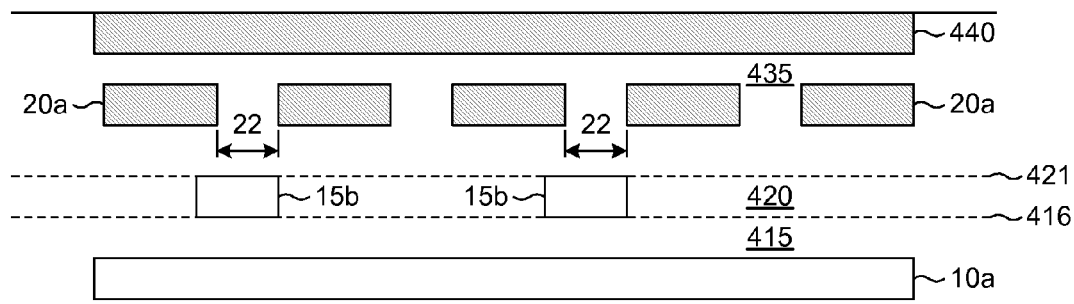
Figure 17:
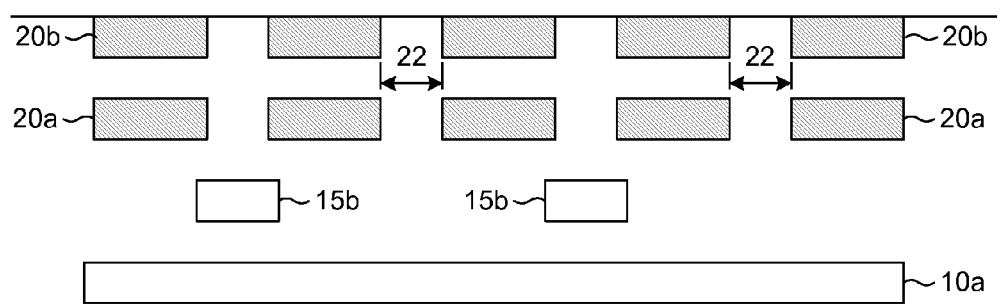

Steps 250-270 of the method may be repeated according to a chosen number of layers of bit lines as represented by step 275 of the implementation of the method illustrated in FIG. 12. For example, as illustrated in the embodiment of FIG. 16, another layer of insulating material, e.g., SiO$_2$, may be deposited at step 250, and a second layer of bit line material 440 may be deposited at step 255. The second layer of bit line material 440 may be patterned at step 260, HDP oxide may be used in a fill-in step 265, and CMP may be performed at step 270. These steps may yield a result as illustrated in FIG. 17 showing two layers of bit lines 20*a* and 20*b* separated by a layer 435 of insulating material. Although insulating material such as oxide is not explicitly shown in FIG. 17, it should be understood that white areas of the diagram typically are filled with insulating material as already described.

Figure 18:
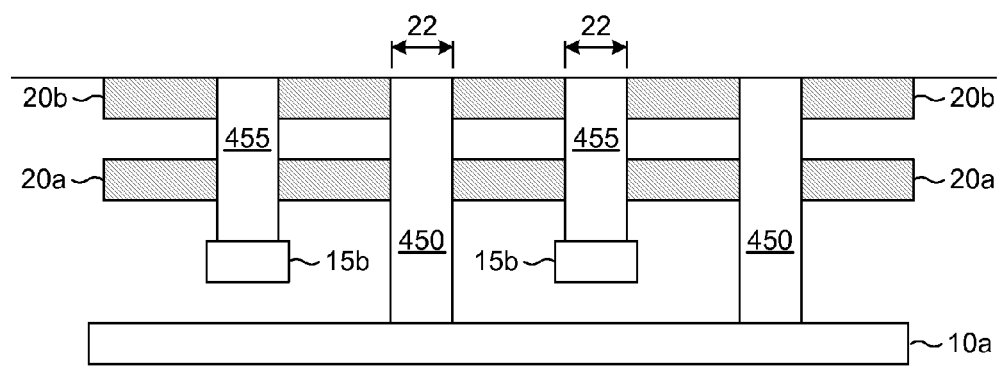
Figure 19:
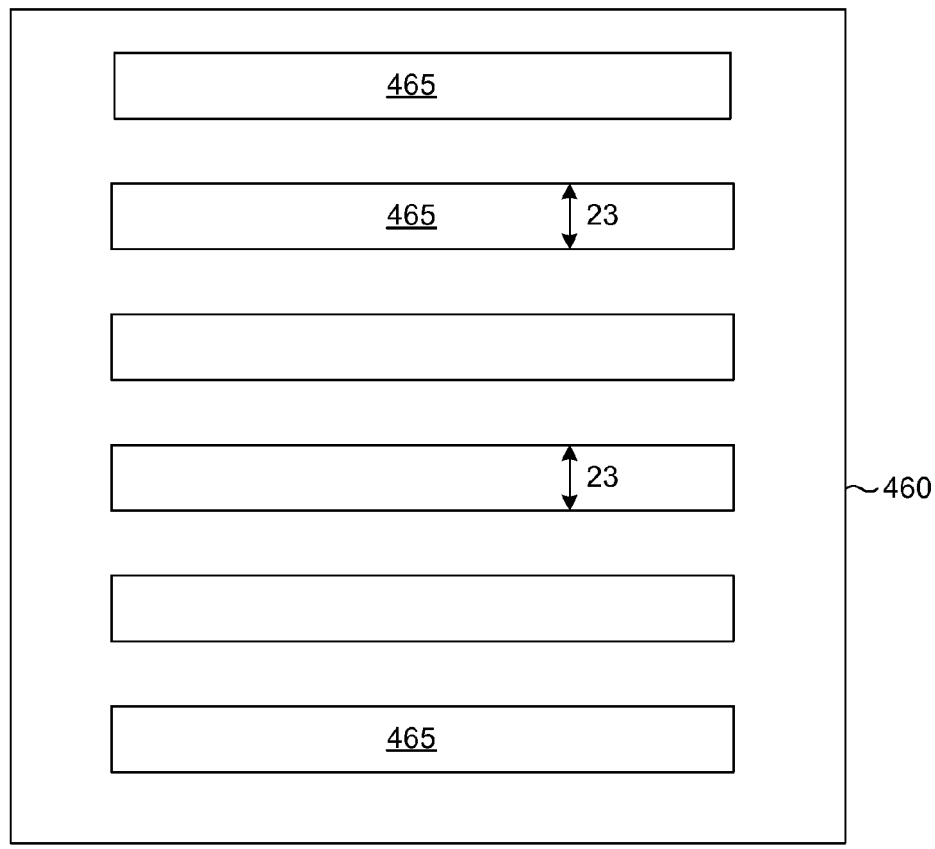
FIG. 19 is a plan view of an embodiment of a mask that defines a pattern of a self-aligned etch step in the method of FIG. 12.

A self-aligned deep etch may be performed at step 280 to form a plurality of via. The deep etch, which may employ an etchant having a higher selectivity for oxide than for polysilicon or metal, may remove oxide in order to form substantially vertical via. The via may extend from first word lines 10*a* and from shelf portions 15*b* of second word lines 10*b* beside and between first and second bit lines 20*a* and 20*b* as illustrated in FIG. 18. In particular, first via 450 may extend from first word lines 10*a*, and second via 455 may extend from shelf portions 15*b* of second word lines 10*b*. A mask 460 comprising open areas 465 that may define the pattern of the etch is illustrated in FIG. 19. Photolithographic techniques well known in the art may cause etching to occur in open areas not occupied by polysilicon or metal according to a placement of the mask 460 on an upper surface of the structure shown in FIG. 18. The mask 460 may be oriented with length dimensions of the plurality of open areas 465 oriented parallel to first and second word lines 10*a* and 10*b* and orthogonal to the layers of bit lines (e.g. bit lines 20*a* and 20*b* in FIG. 17). Horizontal extents of the via 450 and 455 are therefore determined in a first direction nominally parallel to the bit lines by a width dimension 23 of the plurality of open areas 465 and in a second direction substantially orthogonal to the bit lines by the spacing 22 (FIGS. 16-18).

Figure 20:
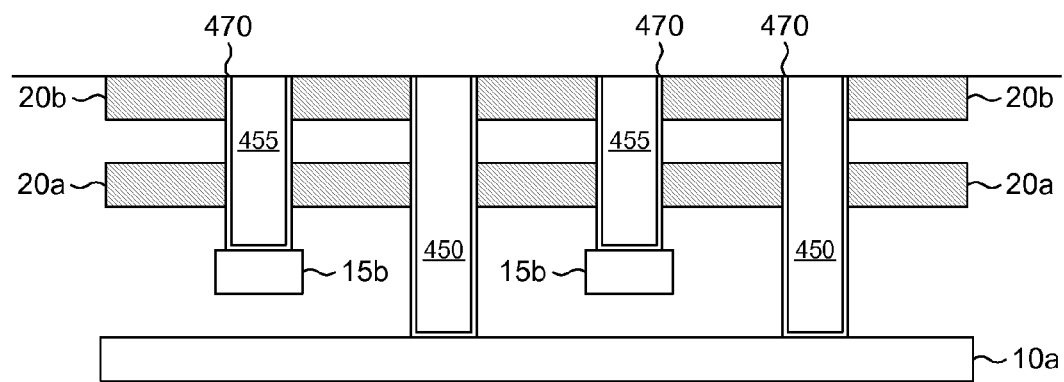
FIGS. 20-23 are cross-sectional diagrams illustrating further results of applying steps of the method of FIG. 12.
Figure 21:
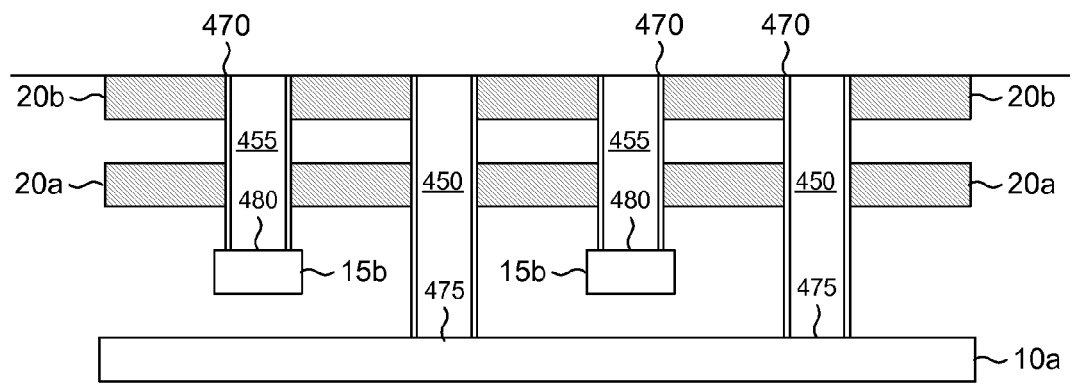

A sidewell oxide 470, e.g., SiO$_2$, may be deposited on sidewalls and bottom surfaces of the via 450 and 455 at step 285 as illustrated in FIG. 20. The oxide may be deposited to a thickness of about 1 nm to about 5 nm, nominally 2 nm. A non-isotropic etch then may be performed at step 290 with the etch directed in a substantially vertical direction to remove oxide at bottoms of the via 450 and 455. The non-isotropic etch thereby creates first oxide openings 475 that expose first word lines 10*a* as illustrated in FIG. 21. The etch further creates second oxide openings 480 that expose shelf portions 15*b* of second word lines 10*b*.

Figure 22:
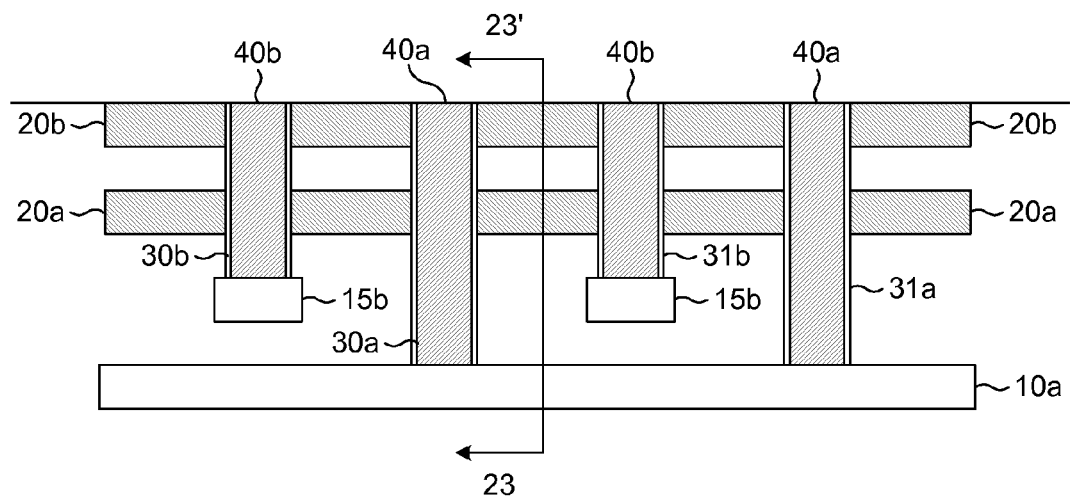

Contacts with first word lines 10*a* and second word lines 10*b* (through shelf portions 15*b*) then may be formed by depositing material to form respective first and second via plugs 40*a* and 40*b* at step 295 as depicted in FIG. 22. It should be noted that first and second via plugs 40*a* and 40*b*, which, in a typical embodiment, may formed of P-type polysilicon, have formed on sidewalls thereof, oxide strips that may constitute anti-fuse dielectric material 30*a*, 31*a*, 30*b*, and 31*b* that also is disposed beside bit lines 20*a* and 20*b*. The structure depicted in cross-section in FIG. 22 should be compared with the perspective view of the memory device illustrated in FIG. 1. Bit lines may be connected to, for example, a metal layer on a surface of the structure at step 300 of the implementation of the method depicted in FIG. 12.

Figure 23:
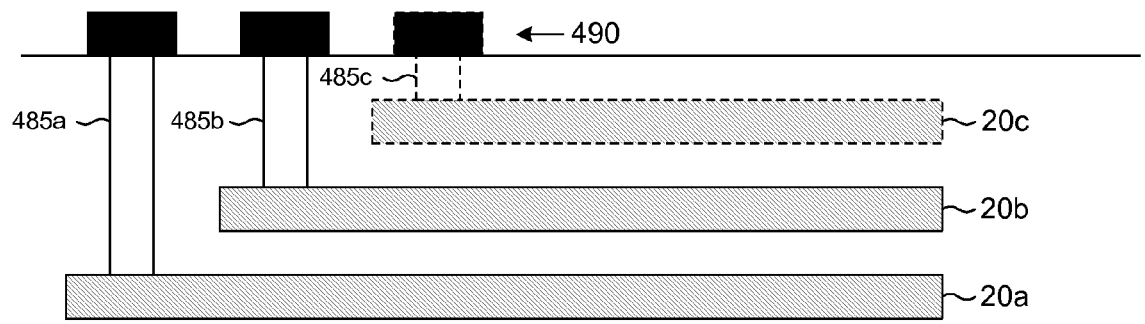

One technique for providing connection of the bit lines is illustrated in FIG. 23, which is a cross-sectional view of the device shown in FIG. 22 taken along a line 23-23'. In the diagram, a first bit line 20*a*, which may represent a plurality of first bit lines 20*a*, is fabricated with a somewhat longer length than the length of a second bit line 20*b*, likewise representing a plurality of second bit lines 20*b*. The difference in lengths of the first bit line 20*a* and the second bit line 20*b* permits respective first and second via plugs 485*a* and 485*b* to be formed. First and second via plugs 485*a* and 485*b* may connect respective first and second bit lines 20*a* and 20*b* to connections in a metal layer 490, for example. In a typical embodiment, first and second via plugs 485*a* and 485*b* are formed of one of N+ polysilicon, tungsten, or other conducting material. A third bit line 20*c*, which may represent a third plurality of bit lines 20*c* and an associated third via plug 485*c* are shown in phantom in FIG. 23, emphasizing that, although the examples disclosed herein, generally, comprise two layers of bit lines, the invention contemplates memory devices comprising three or more layers of bit lines.

Figure 24:
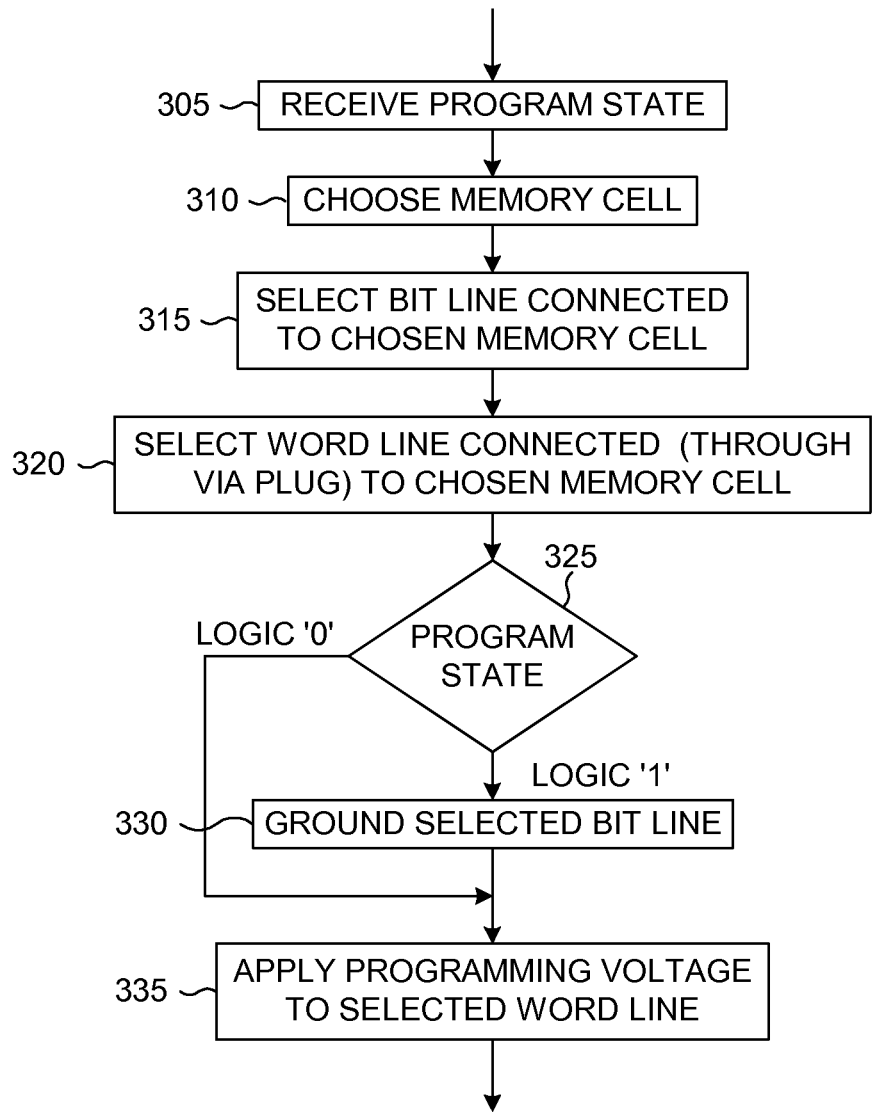
FIG. 24 is a flow diagram illustrating steps of an implementation of a method of programming memory cells in a stacked bit line dual word line nonvolatile memory device according to the present invention.

A method of operation of the present invention may include programming memory cells in the stacked bit line dual word line nonvolatile memory device. One implementation of a programming method may be illustrated by a flow diagram shown in FIG. 24. This implementation of the method comprises receiving a program state (i.e. logic '0' or logic '1') at step 305. A memory cell to be programmed is chosen at step 310. As an illustrative example, memory cell 51*b* (FIG. 9) may be chosen at step 310. At step 315 a bit line connected (through anti-fuse dielectric material) to the chosen memory cell is selected. Referring to FIG. 9, it should be clear that only one of the second bit lines 20*b* lies adjacent to and is connected at step 315 (through anti-fuse dielectric material) to the selected memory cell. A word line connected (through a via plug) to the chosen memory cell is selected at step 320. Referring again to FIG. 9, word line 10*a*, which connects to memory cell 51*b*, is selected at step 320. According to a value of the program state received at step 305, a test is performed at step 325. If the received program state is logic '1', then the selected bit line is grounded at step 330. All unselected word lines are allowed to float, and, if the received program state is determined at step 325 to be logic '0', then the selected bit line also is allowed to float. A programming voltage (e.g., clock pulses) is applied directly to the selected word line. In general, values are programmed into selected memory cells by blowing the anti-fuse dielectric material for logical 1's but not logical 0's on positive swings, negative swings or both positive and negative swings of the programming voltage pulse cycles. While the implementation of the programming method described in FIG. 24 applies to the programming of a single memory cell, it should be appreciated that all memory cells connected to a chosen word line may be programmed simultaneously according to a straightforward modification of the implementation as described.

As an alternative example, in another embodiment of the present invention, a first cell 51*b* (FIG. 9) may be programmed by grounding the first word line 10*a* to which it is coupled at 0V reference voltage and applying about 5V to 15V programming voltage to the second bit line 20*b* to which it is coupled, with other bit and word lines allowed to assume a floating voltage. A second cell 50*b* may be programmed by grounding the second word line 10*b* (invisible in FIG. 9) to which it is coupled at 0V reference voltage and applying about +5V to 15V programming voltage to the second bit line 20*b* to which it is coupled with other bit and word lines allowed to assume a floating voltage.

In view of the foregoing, it will be understood by those skilled in the art that the methods of the present invention can facilitate formation and code programming of nonvolatile memory devices in an integrated circuit. The above-described embodiments have been provided by way of example, and the present invention is not limited to those examples. Multiple variations and modification to the disclosed embodiments will occur, to the extent not mutually exclusive, to those skilled in the art upon consideration of the foregoing description. Such variations and modification, however, fall well within the scope of the present invention as set forth in the following claims.

What is claimed is:

1. A memory device, comprising:
a substrate;
a first conductive element;
a first conductive line over the substrate and coupled to the first conductive element, the first conductive line orthogonal to the first conductive element;
second and third conductive elements orthogonal to the first conductive element;
a first memory cell between the second and first conductive elements on a sidewall beside the first conductive element;
a second memory cell between the third and first conductive elements on the sidewall beside the first conductive element, wherein the first memory cell is over the second memory cell, and the sidewall extends from the first memory cell to the second memory cell; and
a second conductive line parallel to the first conductive line, and a fourth conductive element orthogonal to and coupled to the second conductive line through a conductive pad.

2. The memory device of claim 1, further comprising a fifth conductive element orthogonal to and coupled to the first conductive line.

3. The memory device of claim 2, further comprising sixth and seventh conductive elements orthogonal to the fifth conductive element.

4. The memory device of claim 3, further comprising
a third memory cell between the sixth and fifth conductive elements; and
a fourth memory cell between the seventh and fifth conductive elements, wherein
the third memory cell is over the fourth memory cell.

5. The memory device of claim 1, further comprising eighth and ninth conductive elements orthogonal to the fourth conductive element.

6. The memory device of claim 5, further comprising
a fifth memory cell between the eighth and fourth conductive elements; and
a sixth memory cell between the ninth and fourth conductive elements, wherein the fifth memory cell is over the sixth memory cell.

7. The memory device of claim 1, further comprising:
a seventh memory cell between the second conductive element and a tenth conductive element on a sidewall beside the tenth conductive element; and
an eighth memory cell between the third and tenth conductive elements on the sidewall beside the tenth conductive element, wherein the seventh memory cell is over the eighth memory cell.

8. The memory device of claim 1, wherein the first conductive line is disposed on a first horizontal plane and the second conductive line is disposed on a second horizontal plane different than the first horizontal plane.

9. The memory device of claim 1, wherein the first conductive line is disposed on a first horizontal plane and the conductive pad is disposed on a second horizontal plane different than the first horizontal plane.

10. The memory device of claim 1, wherein the conductive pad is disposed over the first conductive line.

11. A memory device, comprising:
a substrate;
first and second conductive lines over the substrate and extending in a first direction;
a first conductive element orthogonal to and coupled to the first conductive line;
a second conductive element orthogonal to and coupled to the second conductive line,
wherein the first and second conductive elements are disposed along a line extending in the first direction;
a first memory cell on a first sidewall of the first conductive element;
a second memory cell on a second sidewall of the second conductive element;
a third conductive element orthogonal to the first conductive element; and
a fourth conductive element orthogonal to the second conductive element, wherein the third conductive element is over the fourth conductive element.

12. The memory device of claim 11, wherein the first memory cell is between the first conductive element and the third conductive element.

13. The memory device of claim 12, wherein the second memory cell is between the second conductive element and the fourth conductive element.

14. The memory device of claim 13, further comprising a fifth conductive element orthogonal to the first conductive element.

15. The memory device of claim 14, further comprising a sixth conductive element orthogonal to the second conductive element.

16. The memory device of claim 15, further comprising a third memory cell between the fifth conductive element and the first conductive element.

17. The memory device of claim 16, further comprising a fourth memory cell between the sixth conductive element and the second conductive element.

18. The memory device of claim 17, wherein the fourth memory cell is over the third memory cell.

19. The memory device of claim 11, wherein the second conductive element is coupled to the second conductive line through a conductive pad.

20. The memory device of claim 19, wherein the first conductive line is disposed on a first horizontal plane and the conductive pad is disposed on a second horizontal plane different than the first horizontal plane.

21. The memory device of claim 11, wherein the first conductive line is disposed on a first horizontal plane and the second conductive line is disposed on a second horizontal plane different than the first horizontal plane.

22. A memory device, comprising:
a first conductive element;
a first conductive line coupled to the first conductive element, the first conductive line orthogonal to the first conductive element;
second and third conductive elements orthogonal to the first conductive element, the second and third conductive elements extending in a first direction;
a fourth conductive element, orthogonal to the second and third conductive elements, the first and fourth conductive elements arranged in a second direction, the second direction different than the first direction;
a first memory cell between the second and first conductive elements;

a second memory cell between the third and first conductive elements; and a third memory cell between the second and fourth conductive elements, wherein the first memory cell is over the second memory cell, the first memory cell is chosen by selecting the first and second conductive elements, the second memory cell is chosen by selecting the first and third conductive elements, and the third memory cell is chosen by selecting the second and fourth conductive elements.

23. The memory device of claim 22, further comprising a fifth conductive element orthogonal to and coupled to the first conductive line.

24. The memory device of claim 23, further comprising sixth and seventh conductive elements orthogonal to the fifth conductive element.

25. The memory device of claim 24, further comprising a fourth memory cell between the sixth and fifth conductive elements; and a fifth memory cell between the seventh and fifth conductive elements, wherein the fourth memory cell is over the fifth memory cell.

26. The memory device of claim 22, further comprising:
a second conductive line coupled to the fourth conductive element through a conductive pad, the second conductive line orthogonal to the fourth conductive element.

27. The memory device of claim 26, wherein the first conductive line is disposed on a first horizontal plane and the second conductive line is disposed on a second horizontal plane different than the first horizontal plane.

28. The memory device of claim 26, wherein the first conductive line is disposed on a first horizontal plane and the conductive pad is disposed on a second horizontal plane different than the first horizontal plane.

29. The memory device of claim 22, wherein the first direction is orthogonal to the second direction.

* * * * *